United States Patent
Cha

(10) Patent No.: US 12,532,512 B2
(45) Date of Patent: Jan. 20, 2026

(54) SEMICONDUCTOR DEVICE INCLUDING OXIDE SEMICONDUCTOR AND METHOD FOR FABRICATING THE SAME

(71) Applicant: SK hynix Inc., Gyeonggi-do (KR)

(72) Inventor: Jun Hwe Cha, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 314 days.

(21) Appl. No.: 18/363,736

(22) Filed: Aug. 2, 2023

(65) Prior Publication Data

US 2024/0274722 A1 Aug. 15, 2024

(30) Foreign Application Priority Data

Feb. 13, 2023 (KR) .......................... 10-2023-0018737

(51) Int. Cl.
*H10D 30/67* (2025.01)
*H10D 30/01* (2025.01)
*H10D 62/10* (2025.01)

(52) U.S. Cl.
CPC ....... *H10D 30/6755* (2025.01); *H10D 30/031* (2025.01); *H10D 62/10* (2025.01)

(58) Field of Classification Search
None
See application file for complete search history.

(56) References Cited

U.S. PATENT DOCUMENTS

| 9,893,203 | B2 * | 2/2018 | Bang | H10D 30/0321 |
| 2008/0230835 | A1 * | 9/2008 | Shingu | H10D 30/0321 |
| | | | | 257/E29.147 |
| 2014/0127868 | A1 * | 5/2014 | Saito | H10D 30/6755 |
| | | | | 438/197 |
| 2015/0228799 | A1 * | 8/2015 | Koezuka | H10D 30/6733 |
| 2019/0363108 | A1 * | 11/2019 | Ando | H10D 30/6755 |
| 2021/0336040 | A1 | 10/2021 | Wei | |

FOREIGN PATENT DOCUMENTS

KR 10-1952954 B1 2/2019

OTHER PUBLICATIONS

S. Knobelspies et al., Improvement of contact resistance in flexible a-IGZO thin-film transistors by CF4/O2 plasma treatment, Solid State Electronics, Oct. 6, 2018, pp. 23-27, 150.

Jihyun Ka et al., Electrode metal penetration of amorphous indium gallium zinc oxide semiconductor thin film transistors, Current Applied Physics, Mar. 16, 2015, pp. 675-678, 15.

* cited by examiner

*Primary Examiner* — Khaja Ahmad
(74) *Attorney, Agent, or Firm* — IP & T GROUP LLP

(57) ABSTRACT

A semiconductor device includes: a substrate; two heating patterns arranged to be spaced apart from each other over the substrate; two metal oxide patterns respectively positioned over the two heating patterns; two second oxide semiconductor patterns comprising source/drain regions and respectively positioned over the two metal oxide patterns; a first oxide semiconductor pattern forming a channel region positioned between the two second oxide semiconductor patterns; a gate electrode positioned over or below the first oxide semiconductor pattern; and a gate dielectric layer interposed between the gate electrode and the first oxide semiconductor pattern, wherein an oxygen density of the two second oxide semiconductor patterns is smaller than an oxygen density of the first oxide semiconductor pattern.

13 Claims, 7 Drawing Sheets

SEMICONDUCTOR DEVICE INCLUDING OXIDE SEMICONDUCTOR AND METHOD FOR FABRICATING THE SAME

CROSS-REFERENCE TO RELATED APPLICATIONS

The present application claims priority of Korean Patent Application No. 10-2023-0018737, filed on Feb. 13, 2023, which is incorporated herein by reference in its entirety.

BACKGROUND

1. Field

Various embodiments of the present disclosure relate to semiconductor technology, and more particularly, to a semiconductor device including an oxide semiconductor, and a method for fabricating the same.

2. Description of the Related Art

Conventionally, amorphous silicon or polysilicon has been mainly used as a semiconductor layer of a semiconductor device, such as a transistor. Amorphous silicon has an advantage of securing uniform device characteristics through a relatively inexpensive and simple process, while having a disadvantage of low carrier mobility. Polysilicon may be obtained by crystallizing amorphous silicon and may have a relatively high carrier mobility compared to the amorphous silicon. However, when polysilicon is formed, it is required to perform a recrystallization process, and it is difficult to secure uniform device characteristics. Recently, an oxide semiconductor has been proposed as a semiconductor material having a high carrier mobility, which is an advantage over polysilicon, and uniform device characteristics, which is an advantage over amorphous silicon.

SUMMARY

Embodiments of the present disclosure are directed to a semiconductor device capable of reducing processing cost and processing time while reducing contact resistance between an oxide semiconductor and a source/drain, and a method for fabricating the semiconductor device.

In accordance with one embodiment of the present disclosure, a semiconductor device includes: a substrate; two heating patterns arranged to be spaced apart from each other over the substrate; two metal oxide patterns respectively positioned over the two heating patterns; two second oxide semiconductor patterns comprising source/drain regions and respectively positioned over the two metal oxide patterns; a first oxide semiconductor pattern forming a channel region positioned between the two second oxide semiconductor patterns; a gate electrode positioned over or below the first oxide semiconductor pattern; and a gate dielectric layer interposed between the gate electrode and the first oxide semiconductor pattern, wherein an oxygen density of the two second oxide semiconductor patterns is smaller than an oxygen density of the first oxide semiconductor pattern.

In accordance with another embodiment of the present disclosure, a method for fabricating a semiconductor device includes: forming over a substrate two heating patterns spaced apart from each other and a dielectric pattern in which the two heating patterns are buried; forming an oxide semiconductor layer over the two heating patterns and the dielectric pattern; irradiating light toward the oxide semiconductor layer to generate heat from the two heating patterns so that oxygen is released from a portion of the oxide semiconductor layer contacting the two heating patterns into the two heating patterns; and forming a gate dielectric layer and a gate electrode over or under the oxide semiconductor layer.

DETAILED DESCRIPTION

Figure 1:
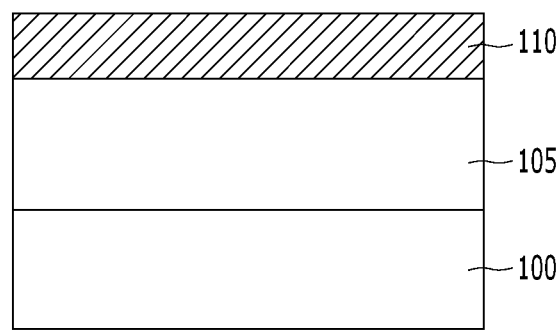
FIGS. 1 to 7 are cross-sectional views illustrating a semiconductor device and a method for fabricating the same in accordance with one embodiment of the present disclosure.

Various embodiments of the present disclosure will be described below in more detail with reference to the accompanying drawings. The present disclosure may, however, be realized in different forms and should not be construed as limited to the embodiments set forth herein. Rather, these embodiments are provided so that this disclosure will convey the scope of the present disclosure to those skilled in the art. Throughout the disclosure, like reference numerals refer to like parts throughout the various figures and embodiments of the present disclosure.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but may also refer to a case where a third layer exists between the first layer and the second layer or the substrate.

Figure 5:
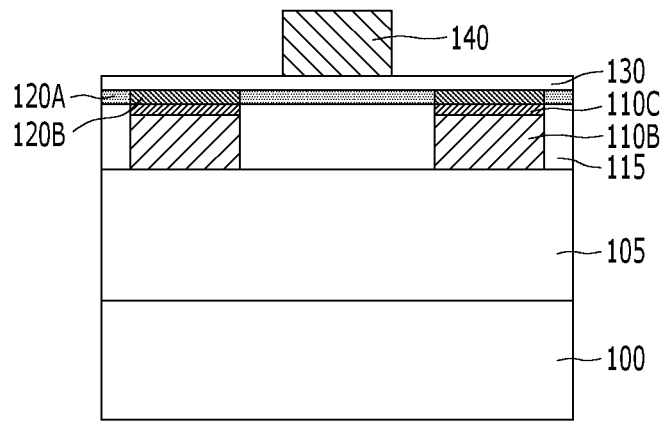
Figure 6:
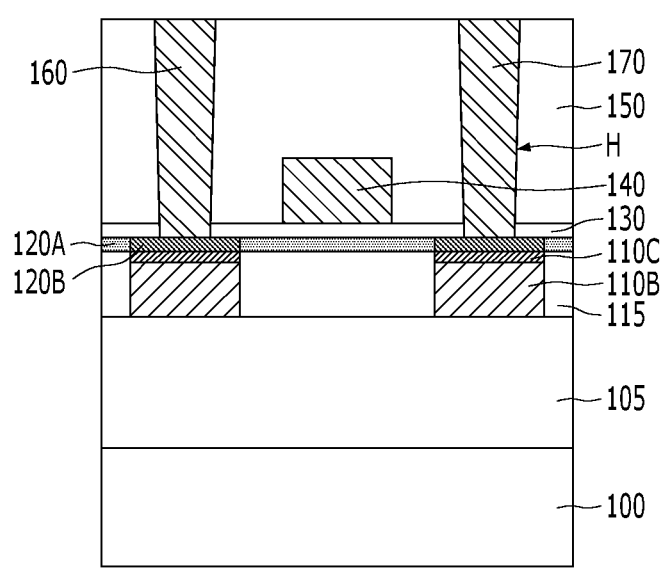
Figure 7:
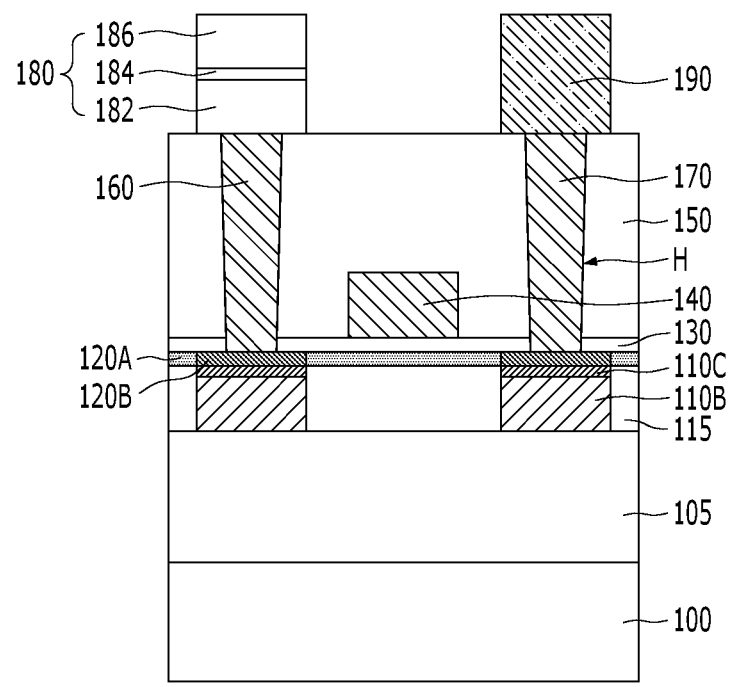

FIGS. 1 to 7 are cross-sectional views illustrating a semiconductor device and a method for fabricating the same in accordance with various embodiments of the present disclosure. FIG. 7 shows the semiconductor device of this embodiment of the present disclosure, and FIGS. 1 to 6 show intermediate process steps for fabricating the semiconductor device shown in FIG. 7. FIG. 7 shows one transistor, and a storage element and a conductive line that are electrically connected to the source/drain regions of the transistor, respectively.

First, the fabrication method will be described.

Referring to FIG. 1, a dielectric layer 105 may be formed over a substrate 100.

The substrate 100 may include diverse materials, such as semiconductor materials and dielectric materials. The dielectric layer 105 may include diverse dielectric materials, such as silicon nitride, silicon oxide, silicon oxynitride, or a combination thereof, and may have a single layer structure or a multi-layer structure. When the substrate 100 includes a dielectric material, for example, a dielectric substrate, the dielectric layer 105 may be omitted.

Subsequently, a heating layer 110 may be formed over the dielectric layer 105.

The heating layer 110 may include a material that efficiently generates heat when irradiated with light, for example, a metal material. When the heating layer 110 includes a metal material, heat may be generated from the heating layer 110 by a coupling between photons of the irradiated light and electrons abundant in the metal, in other words, a photothermal reaction. The non-limiting examples of the metal materials may include a metal, such as, tantalum (Ta), tungsten (W), titanium (Ti), molybdenum (Mo), aluminum (Al), copper (Cu), chromium (Cr), ruthenium (Ru), nickel (Ni), indium (In), gold (Au), silver (Ag) and zirconium (Zr), an alloy of the metal, or a compound of the metal, or a combination thereof. Furthermore, a metal material having a high oxidizing power, for example, a metal material having a formation free energy of lower than −200 kJ/mol $O_2$ at a temperature of approximately 800 degrees Celsius or less in Ellingham diagrams, may be used as the heating layer 110.

Figure 2:
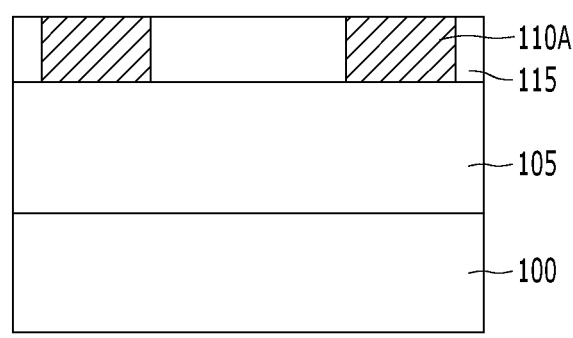

Referring to FIG. 2, after an initial heating pattern 110A is formed by selectively etching the heating layer 110, a dielectric pattern 115 filling the space between the initial heating patterns 110A may be formed.

The initial heating pattern 110A may be formed to overlap with each of a source electrode and a drain electrode (see reference numerals 160 and 170 in FIG. 6), which will be described later. Since the present embodiment relates to one transistor including two source/drain regions, two initial heating patterns 110A may be formed to be spaced apart from each other in a cross-sectional direction. However, the present disclosure is not limited thereto, and a plurality of transistors may be arranged in diverse forms, and in this case, three or more heating patterns may be arranged.

The dielectric patterns 115 may include diverse dielectric materials, such as for example silicon oxide, silicon nitride, silicon oxynitride, or a combination thereof. The dielectric patterns 115 may be formed by depositing a dielectric material over the dielectric layer 105 and the initial heating pattern 110A to a thickness that may sufficiently fill the space between the initial heating patterns 110A, and then performing a planarization process, e.g., Chemical Mechanical Polishing (CMP), until the top surface of the initial heating pattern 110A is exposed.

Meanwhile, in FIGS. 1 and 2, the process of forming the initial heating pattern 110A first and then forming the dielectric patterns 115 has been described, but the present disclosure is not limited thereto. According to another embodiment of the present disclosure, the initial heating pattern 110A may be formed by forming the dielectric pattern 115, which provides a space where the initial heating pattern 110A is to be formed by depositing a dielectric material over the dielectric layer 105 and selectively etching the dielectric material, first and then filling the space with a heating material, for example, a metal material.

Figure 3:
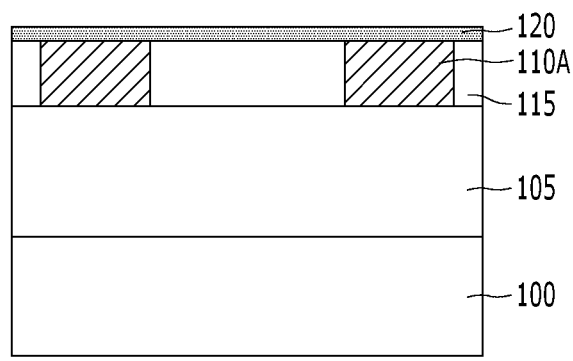

Referring to FIG. 3, an oxide semiconductor layer 120 may be formed over the initial heating pattern 110A and the dielectric pattern 115.

The oxide semiconductor layer 120 may serve to provide a channel region and a source/drain region of a transistor. The oxide semiconductor layer 120 may include an oxide of at least one metal among groups—12, 13 and 14 metals, such as for example zinc (Zn), indium (In), gallium (Ga), tin (Sn), cadmium (Cd), germanium (Ge), and hafnium (Hf), or a combination thereof. For example, the oxide semiconductor layer 120 may include In—Sn—Ga—Zn oxide, In—Ga—Zn oxide, In—Sn—Zn oxide, In—Al—Zn oxide, Sn—Ga—Zn oxide, Al—Ga—Zn oxide, Sn—Al—Zn oxide, In—Zn oxide, Sn—Zn oxide, Al—Zn oxide, Zn—Mg oxide, Sn—Mg oxide, In—Mg oxide, In—Ga oxide and the like, or a combination thereof.

Figure 4:
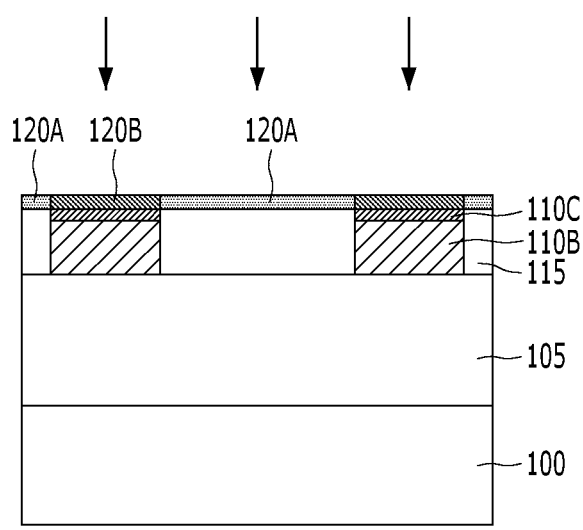

Referring to FIG. 4, light may be irradiated toward the process result of FIG. 3, particularly toward the oxide semiconductor layer 120 (see arrow). The light may be irradiated in a direction from top to bottom, and light of the visible ray band may be used.

When light is irradiated onto the oxide semiconductor layer 120, the light may pass through the transparent oxide semiconductor layer 120 and reach the initial heating pattern 110A, and heat may be generated from the initial heating pattern 110A by a photothermal reaction, which is described above. Since heat is generated from the initial heating pattern 110A by the photothermal reaction, heat may be generated even though light is irradiated for a short time of approximately 1 nanosecond (ns) to 1 second (s). For example, a lamp, such as a laser or an Xe lamp, may be used as a light source, and light energy may have a range of approximately 1 J/cm² to 100 J/cm². The wavelength band of light may have a range of approximately 200 to 1000 nm.

When heat is generated in the initial heating pattern 110A, the heating of the oxide semiconductor layer 120 from the heating of the initial heating pattern 110A may deprive the oxide semiconductor layer 120 of oxygen, for example by oxygen diffusing from the oxide semiconductor layer 120 toward the initial heating pattern 110A. As a result, oxygen may be released from a portion of the oxide semiconductor layer 120 contacting the initial heating pattern 110A, decreasing the oxygen density. Herein, the portion of the oxide semiconductor layer 120 contacting the initial heating pattern 110A from which oxygen is released will be referred to as a second oxide semiconductor pattern 120B, and the remaining portion of the oxide semiconductor layer 120 except the second oxide semiconductor pattern 120B will be referred to as a first oxide semiconductor pattern 120A. The second oxide semiconductor pattern 120B may have a lower oxygen density than the first oxide semiconductor pattern 120A. In other words, the second oxide semiconductor pattern 120B may have a higher oxygen vacancy density than the first oxide semiconductor pattern 120A. Since the first oxide semiconductor pattern 120A does not directly contact the initial heating pattern 110A, oxygen is not lost, but internal defects may be reduced due to the influence of the heat generated from the initial heating pattern 110A. In other words, the first oxide semiconductor pattern 120A may have less internal defects than the initially deposited oxide semiconductor layer 120, and thus the first oxide semiconductor pattern 120A may have improved crystallinity than the oxide semiconductor layer 120. Two second oxide semiconductor patterns 120B may be formed respectively corresponding to the two initial heating patterns 110A, and may function as the source/drain regions of transistors. The first oxide semiconductor pattern 120A between the two second oxide semiconductor patterns 120B may function as a channel region of a transistor.

Meanwhile, oxygen taken by the initial heating pattern 110A may be bonded with a metal in the initial heating pattern 110A to form a metal oxide pattern 110C. The metal oxide pattern 110C may be formed on an upper portion of the initial heating pattern 110A which is adjacent to the oxide semiconductor layer 120. The remaining portion of the initial heating pattern 110A except the metal oxide pattern 110C may be maintained with the same material as the initial heating pattern 110A. This remaining portion will be, hereinafter, referred to as a heating pattern 110B. The metal oxide pattern 110C may be interposed between the second oxide semiconductor pattern 120B and the heating pattern 110B to physically separate them from each other. When the metal oxide pattern 110C is a dielectric material, the second oxide semiconductor pattern 120B and the remaining heating pattern 110B may be physically and electrically separated from each other by the metal oxide pattern 110C.

Referring to FIG. 5, a gate dielectric layer 130 may be formed over the first oxide semiconductor pattern 120A and the second oxide semiconductor pattern 120B.

The gate dielectric layer 130 may include diverse dielectric materials, such as for example silicon oxide, silicon nitride, silicon oxynitride, and aluminum oxide, or a combination thereof. Also, the gate dielectric layer 130 may include a high-k material having a higher dielectric constant than silicon oxide, such as for example, zirconium oxide, hafnium oxide, lanthanum oxide, tantalum oxide, or titanium oxide, or a combination thereof.

Subsequently, a gate electrode 140 may be formed over the gate dielectric layer 130.

The gate electrode 140 may include diverse conductive materials, such as for example a metal, an alloy, or a metal compound, or a combination thereof. The gate electrode 140 may be formed to overlap with the first oxide semiconductor pattern 120A between the two second oxide semiconductor patterns 120B. In this cross-sectional direction, the width of the gate electrode 140 may be equal to or less than the width of the first oxide semiconductor pattern 120A between the two second oxide semiconductor patterns 120B.

Referring to FIG. 6, an inter-layer dielectric layer 150 covering the process result of FIG. 5 may be formed.

The inter-layer dielectric layer 150 may include diverse dielectric materials, such as for example silicon oxide, silicon nitride, and silicon oxynitride, or a combination thereof, and may be formed to have a thickness that may sufficiently cover the gate electrode 140.

Subsequently, the inter-layer dielectric layer 150 and the gate dielectric layer 130 may be selectively etched to form two holes H that respectively expose the two second oxide semiconductor patterns 120B.

Subsequently, a source electrode 160 and a drain electrode 170 filling the respective holes H may be formed.

The source electrode 160 and the drain electrode 170 may include diverse conductive materials, such as a metal, an alloy, or a metal compound. The source electrode 160 and the drain electrode 170 may be formed by forming a conductive material to a thickness that is sufficient to fill the holes H and then performing a planarization process until the top surface of the inter-layer dielectric layer 150 is exposed. The positions of the source electrode 160 and the drain electrode 170 may be reversed. In other words, unlike what is shown in FIG. 6, the source electrode 160 may be positioned on the right side of the gate electrode 140, and the drain electrode 170 may be positioned on the left side of the gate electrode 140.

The bottom surfaces of the source electrode 160 and the drain electrode 170 may be electrically connected to the second oxide semiconductor pattern 120B by directly contacting the second oxide semiconductor pattern 120B. The areas of the bottom surfaces of the source electrode 160 and the drain electrode 170 on a plane may be equal to or less than the area of the second oxide semiconductor pattern 120B.

Referring to FIG. 7, over the inter-layer dielectric layer 150, a storage element 180 that is electrically connected to one among the source electrode 160 and the drain electrode 170 (for example the source electrode 160) may be formed, and a conductive line 190 that is electrically connected to the other one among the source electrode 160 and the drain electrode 170 (for example the drain electrode 170) may be formed.

The storage element 180 may be a part for storing data. For example, the storage element 180 may include a capacitor including a lower electrode 182, an upper electrode 186, and a dielectric material 184 between the lower electrode 182 and the upper electrode 186. However, the present disclosure is not limited thereto, and the storage element 180 may include a variable resistance element that stores different data by switching between different resistance states. The variable resistance element may be formed of diverse materials used for a Resistive Random Access Memory (RRAM), a Phase-change RAM (PRAM), a Magneto-resistive RAM (MRAM), a Ferroelectric RAM (FRAM) and the like. For example, the variable resistance element may have a single layer structure or a multi-layer structure including a metal oxide such as a transition metal oxide and a perovskite-based material, a phase change material such as a chalcogenide-based material, a ferroelectric material, a ferromagnetic material and the like, or a combination thereof.

The conductive line 190 may include diverse conductive materials, such as for example metals, alloys, and metal compounds.

According to one embodiment of the present disclosure, there is provided storage element 180 and conductive line 190 directly contacting the source electrode 160 and the drain electrode 170 respectively as shown, but the present disclosure is not limited thereto. According to another embodiment of the present disclosure, another conductive pattern may be interposed between the storage element 180 and the source electrode 160, and the storage element 180 and the source electrode 160 may be electrically connected through the conductive pattern. Also, according to another embodiment of the present disclosure, another conductive pattern may be interposed between the conductive line 190 and the drain electrode 170, and the conductive line 190 and the drain electrode 170 may be electrically connected through the conductive pattern. Herein, the conductive pattern may include a conductive pattern having diverse shapes, such as a via.

Through the process described above, a semiconductor device as illustrated in FIG. 7 may be fabricated.

Referring back to FIG. 7, the semiconductor device of this embodiment may include a substrate 100, a dielectric layer 105, a heating pattern 110B, a metal oxide pattern 110C, a dielectric pattern 115, a first oxide semiconductor pattern 120A, a second oxide semiconductor pattern 120B, a gate dielectric layer 130, a gate electrode 140, an inter-layer dielectric layer 150, a source electrode 160, a drain electrode 170, a storage element 180, and a conductive line 190.

A stacked structure of the heating pattern 110B and the metal oxide pattern 110C may be formed over the dielectric layer 105 and buried in the dielectric pattern 115. The metal oxide pattern 110C may have sidewalls that are substantially aligned with the heating pattern 110B while overlapping with and directly contacting the heating pattern 110B. According to one embodiment of the present disclosure, the stacked structure of the two heating patterns 110B and the metal oxide pattern 110C may be arranged to be spaced apart from each other. The metal oxide pattern 110C may include an oxide of a metal included in the heating pattern 110B.

The second oxide semiconductor pattern 120B may overlap with and directly contact the metal oxide pattern 110C over the metal oxide pattern 110C. The second oxide semiconductor pattern 120B may have sidewalls that are substantially aligned with the metal oxide pattern 110C. According to one embodiment of the present disclosure, two second oxide semiconductor patterns 120B may be arranged to be spaced apart from each other. The first oxide semiconductor pattern 120A may be positioned over the dielectric pattern 115 in a region where the second oxide semiconductor pattern 120B is not formed. In other words, the first oxide semiconductor pattern 120A may be positioned between and on both sides of the two second oxide semiconductor patterns 120B. Also, the first oxide semiconductor pattern 120A may directly contact the top surface of the dielectric pattern 115. Here, the oxygen density of the second oxide semiconductor pattern 120B may be lower than the oxygen density of the first oxide semiconductor pattern 120A.

The gate dielectric layer 130 may be formed to cover the first and second oxide semiconductor patterns 120A and 120B, and the gate electrode 140 may be formed to overlap with the first oxide semiconductor pattern 120A that is positioned between the two second oxide semiconductor patterns 120B over the gate dielectric layer 130.

The two second oxide semiconductor patterns 120B, the first oxide semiconductor pattern 120A between the two second oxide semiconductor patterns 120B, the gate dielectric layer 130, and the gate electrode 140 may form one transistor. The two second oxide semiconductor patterns 120B and the first oxide semiconductor pattern 120A therebetween may form source/drain regions and a channel region of the transistor, respectively.

The source electrode 160 may pass through the inter-layer dielectric layer 150 and the gate dielectric layer 130 to directly contact one among the two second oxide semiconductor patterns 120B, and the drain electrode 170 may be formed to pass through the inter-layer dielectric layer 150 and the gate dielectric layer 130 and to directly contact the other of the two second oxide semiconductor patterns 120B.

The storage element 180 may be electrically connected to the source electrode 160 over the source electrode 160, and the conductive line 190 may be electrically connected to the drain electrode 170 over the drain electrode 170.

According to the above-described semiconductor device and the fabrication method thereof, the following advantages may be obtained.

First, by lowering the oxygen density of the source/drain region of the oxide semiconductor layer as compared to the oxygen density in other regions (for example the channel region), formation of an insulating oxide between the source/drain electrode and the oxide semiconductor layer may be prevented or reduced. As a result, contact resistance between the source/drain electrodes and the oxide semiconductor layer may be reduced.

Also, a method for lowering the oxygen density of the source/drain region of the oxide semiconductor layer as described above may include forming a heating pattern below the source/drain region of the oxide semiconductor layer before the oxide semiconductor layer is formed, and then forming an oxide semiconductor layer over the heating pattern, and irradiating light thereon. In this case, since only light irradiation for a short time is required, the process time may be shortened.

Furthermore, when the light is irradiated as described above, heat originating from the heating pattern may affect other regions of the oxide semiconductor layer. For example, the first oxide semiconductor pattern 120A in the channel region may have a reduced number of internal defects as compared to the initially deposited oxide semiconductor layer 120 deposited for the channel region. In this case, a separate heat treatment process for reducing internal defects may be omitted, or the heat treatment process time may be reduced. Therefore, the process cost may be reduced, and the process time may be shortened.

Meanwhile, in the above embodiment(s) of the present disclosure, a top gate structure in which a gate electrode is positioned over an oxide semiconductor layer has been described, but the present disclosure is not limited thereto. According to another embodiment of the present disclosure, it is possible to realize a bottom gate structure in which the gate electrode is positioned below the oxide semiconductor layer, or a double gate structure in which the gate electrode is positioned over and below the oxide semiconductor layer. These will be described below with reference to FIGS. 8 to 14.

Figure 10:
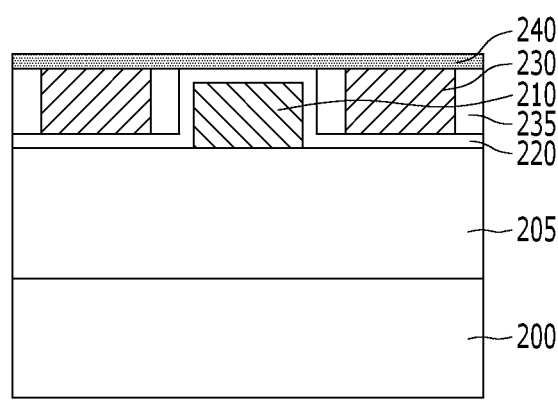
Figure 11:
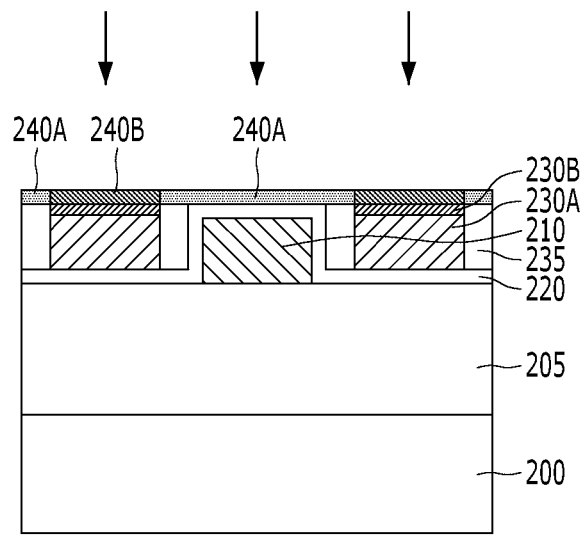
Figure 12:
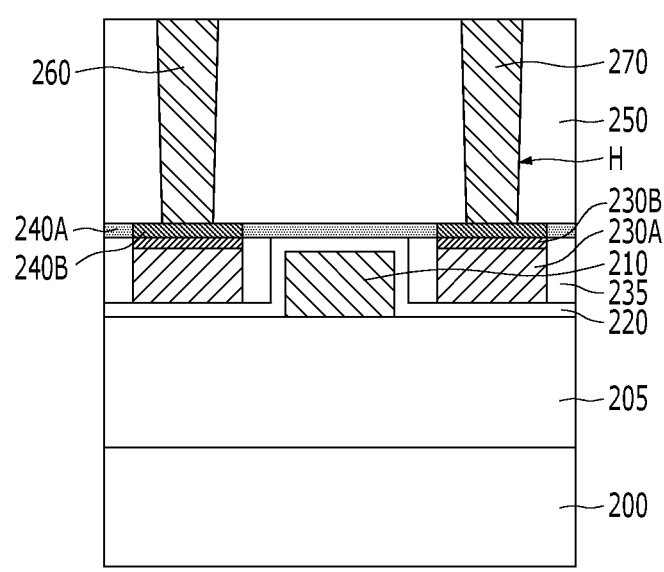

FIGS. 8 to 12 are cross-sectional views illustrating a semiconductor device and a method for fabricating the same in accordance with other embodiments of the present disclosure. FIG. 12 shows the semiconductor device of the embodiment of the present disclosure, and FIGS. 8 to 11 show intermediate process steps for fabricating the semiconductor device of FIG. 12. Differences from the foregoing embodiment will be mainly described.

Figure 8:
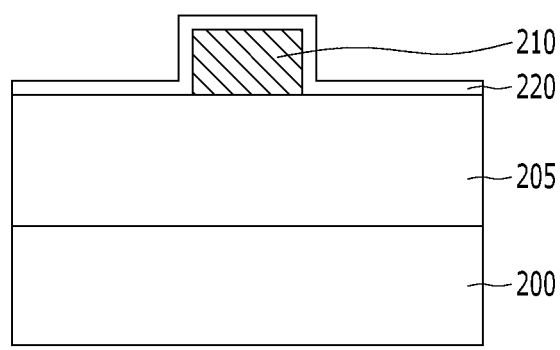
FIGS. 8 to 12 are cross-sectional views illustrating a semiconductor device and a method for fabricating the same in accordance with another embodiment of the present disclosure.

Referring to FIG. 8, a dielectric layer 205 may be formed over a substrate 200.

Subsequently, a gate electrode 210 may be formed over the dielectric layer 205, and then the gate dielectric layer 220 may be formed over the gate electrode 210.

The gate dielectric layer 220 may be conformally formed along a lower profile. Accordingly, the height of the top surface of the gate dielectric layer 220 overlapping with the gate electrode 210 may be higher than the height of the top surface of the gate dielectric layer 220 on both sides of the gate electrode 210. The top surface of the gate dielectric layer 220 overlapping with the gate electrode 210 will be referred to as the uppermost surface of the gate dielectric layer 220 hereinafter.

Figure 9:
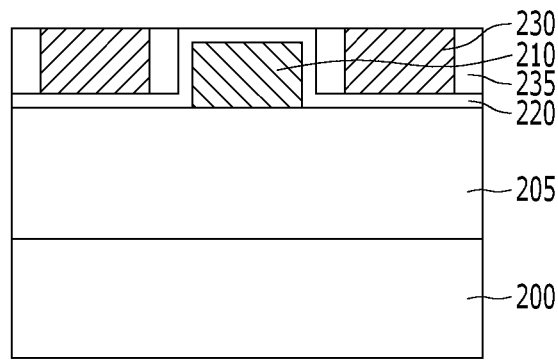

Referring to FIG. 9, initial heating patterns 230 may be formed over the gate dielectric layer 220 on both sides of the gate electrode 210.

The initial heating pattern 230 may be formed by forming a heating layer over the gate dielectric layer 220, performing a planarization process to expose the uppermost surface of the gate dielectric layer 220, and selectively etching the heating layer such that the initial heating pattern 230 is positioned over the gate dielectric layer 220 on both sides of the gate electrode 210. As a result of this process, the top surface of the initial heating pattern 230 may be positioned at substantially the same height as the uppermost surface of the gate dielectric layer 220. However, the present disclosure is not limited thereto, and the planarization process may be omitted according to other embodiments of the present disclosure. In this case, the top surface of the initial heating pattern 230 may be positioned over or below the uppermost surface of the gate dielectric layer 220. In any case, the top surface of the gate dielectric layer 220 is exposed while the initial heating pattern 230 is positioned on both sides of the gate electrode 210 by patterning the heating layer.

Subsequently, a dielectric pattern 235 filling the space between the gate dielectric layer 220 and the initial heating pattern 230 may be formed so that the top surface of the initial heating pattern 230 and the uppermost surface of the gate dielectric layer 220 are exposed.

The dielectric pattern 235 may be formed by depositing a dielectric material having a thickness sufficient to fill the space between the gate dielectric layer 220 and the initial heating pattern 230, and then performing a planarization process until the uppermost surface of the gate dielectric layer 220 and the top surface of the initial heating pattern 230 are exposed. Even though the uppermost surface of the gate dielectric layer 220 and the top surface of the initial heating pattern 230 have different heights, the dielectric pattern 235 may be formed over both of them.

In the above, the process of forming the initial heating pattern 230 first and then forming the dielectric pattern 235 has been described, but the present disclosure is not limited thereto. According to another embodiment of the present disclosure, the dielectric pattern 235 providing a space where the initial heating pattern 230 is to be formed may be formed first by depositing a dielectric material over the gate dielectric layer 220, performing a planarization process to expose the uppermost surface of the gate dielectric layer 220, and selectively etching the dielectric material, and then the initial heating pattern 230 may be formed by filling the space with a heating material, for example, a metal material.

Referring to FIG. 10, an oxide semiconductor layer 240 may be formed on the top surface of the initial heating pattern 230, the dielectric pattern 235, and the gate dielectric layer 220. As a result, the oxide semiconductor layer 240 may directly contact the uppermost surface of the gate dielectric layer 220 while directly contacting the top surface of the initial heating pattern 230.

Referring to FIG. 11, light may be irradiated toward the process result of FIG. 10, particularly toward the oxide semiconductor layer 240 (see arrow).

When light is irradiated onto the oxide semiconductor layer 240, the light may pass through the transparent oxide semiconductor layer 240 and reach the initial heating pattern 230, and heat may be generated from the initial heating pattern 230 by a photothermal reaction. In this case, oxygen in a portion of the oxide semiconductor layer 240 contacting the initial heating pattern 230 may be released toward the initial heating pattern 230, thereby forming the second oxide semiconductor pattern 240B having a reduced oxygen density. A portion of the oxide semiconductor layer 240 that does not contact the initial heating pattern 230 may form the first oxide semiconductor pattern 240A in which oxygen density is substantially maintained. However, defects in the first oxide semiconductor pattern 240A may be less than those in the oxide semiconductor layer 240.

Oxygen released from the initial heating pattern 230 may be bonded with the metal of the initial heating pattern 230 to form a metal oxide pattern 230B. The remainder of the initial heating pattern 230 excluding the metal oxide pattern 230B may be substantially maintained, and the remainder may form the heating pattern 230A.

Referring to FIG. 12, an inter-layer dielectric layer 250 may be formed over the first and second oxide semiconductor patterns 240A and 240B, and then a source electrode 260 and a drain electrode 270 contacting the second oxide semiconductor pattern 240B may be formed by penetrating the inter-layer dielectric layer 250.

As a result, a semiconductor device as illustrated in FIG. 12 may be fabricated.

According to one embodiment of the present disclosure, the gate electrode 210 and the gate dielectric layer 220 may be formed first over the substrate 200 and the dielectric layer 205, and a stacked structure of the heating pattern 230A and the metal oxide pattern 230B may be positioned over the gate dielectric layer 220 on both sides of the gate electrode 210. The heating pattern 230A and the metal oxide pattern 230B may have sidewalls that are aligned with each other while overlapping with and directly contacting each other.

The second oxide semiconductor pattern 240B may overlap with and directly contact the metal oxide pattern 230B over the metal oxide pattern 230B, and may have sidewalls that are aligned with each other. The first oxide semiconductor pattern 240A may be formed over the dielectric pattern 235 and the gate dielectric layer 220 to directly contact them.

The source electrode 260 and the drain electrode 270 may pass through the inter-layer dielectric layer 250 and directly contact the second oxide semiconductor pattern 240B.

According to the embodiment shown in FIG. 12, a bottom gate structure in which a gate electrode is positioned below an oxide semiconductor layer may be realized. Even in this embodiment of the present disclosure, all of the advantages described in the foregoing embodiments may be obtained.

Figure 13:
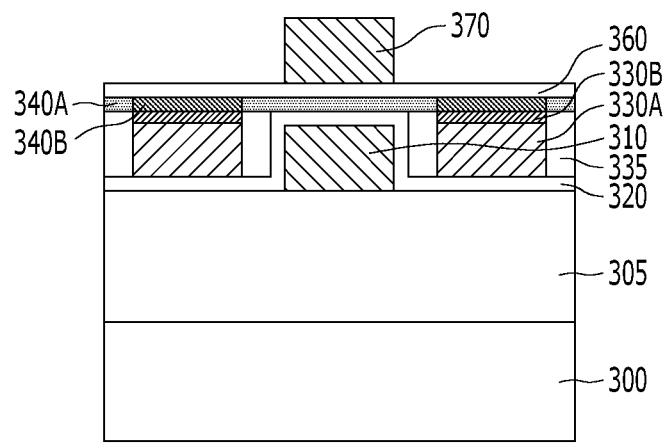
FIGS. 13 and 14 are cross-sectional views illustrating a semiconductor device and a method for fabricating the same in accordance with other embodiments of the present disclosure.
Figure 14:
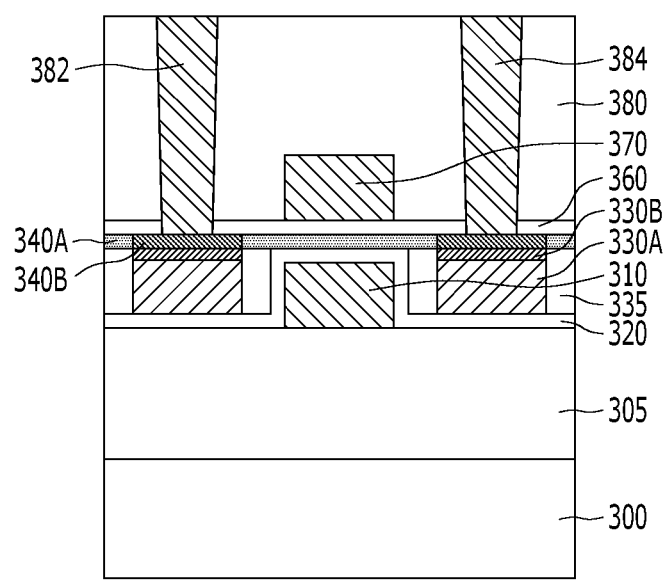

FIGS. 13 and 14 are cross-sectional views illustrating a semiconductor device and a method for fabricating the same in accordance with another embodiment of the present disclosure. FIG. 14 shows a semiconductor device of this embodiment of the present disclosure, and FIG. 13 shows intermediate process steps for fabricating the semiconductor device of FIG. 14. Differences from the above-described embodiments will be mainly described.

Referring to FIG. 13, a structure including a substrate 300, a dielectric layer 305, a first gate electrode 310, a first gate dielectric layer 320, a heating pattern 330A, a metal oxide pattern 330B, a dielectric pattern 335, a first oxide semiconductor pattern 340A, and a second oxide semiconductor pattern 340B may be provided. This structure may be substantially the same as the structure of FIG. 11 described above. In other words, the substrate 300, the dielectric layer 305, the first gate electrode 310, the first gate dielectric layer 320, the heating pattern 330A, the metal oxide pattern 330B, the dielectric pattern 335, the first oxide semiconductor pattern 340A, and the second oxide semiconductor pattern 340B may correspond to the substrate 200, the dielectric layer 205, the gate electrode 210, the gate dielectric layer 220, the heating pattern 230A, the metal oxide pattern 230B, the dielectric pattern 235, the first oxide semiconductor pattern 240A, and the second oxide semiconductor pattern 240B of the foregoing embodiment, respectively. Accordingly, the structure may be formed by substantially the same process as the process for forming the structure of FIG. 11 described above.

Subsequently, after the second gate dielectric layer 360 is formed over the first and second oxide semiconductor patterns 340A and 340B, the second gate electrode 370 may be formed over the second gate dielectric layer 360.

The second gate electrode 370 may be formed to overlap with the first oxide semiconductor pattern 340A between the two second oxide semiconductor patterns 340B. Accordingly, the second gate electrode 370 may overlap with the first gate electrode 310. This embodiment of the present disclosure illustrates a case where both sidewalls of the second gate electrode 370 are aligned with both sidewalls of the first gate electrode 310 in the cross-sectional direction while the second gate electrode 370 have the same width as that of the first gate electrode 310, but the present disclosure is not limited thereto. As long as the second gate electrode 370 overlaps with the first oxide semiconductor pattern 340A between the two second oxide semiconductor patterns 340B, the second gate electrode 370 may have a different width from that of the first gate electrode 310 and may partially overlap with the first gate electrode 310.

Referring to FIG. 14, after an inter-layer dielectric layer 380 covering the second gate dielectric layer 360 and the second gate electrode 370 is formed, a source electrode 382 and a drain electrode 384 passing through the inter-layer dielectric layer 380 and the second gate dielectric layer 360 and contacting the second oxide semiconductor pattern 340B may be formed.

Thus, a semiconductor device as illustrated in FIG. 14 may be fabricated.

According to this embodiment shown in FIG. 14, the first gate electrode 310 and the first gate dielectric layer 320 may be formed first over the substrate 300 and the dielectric layer 305, and a stacked structure of the heating pattern 330A and the metal oxide pattern 330B may be positioned over the first gate dielectric layer 320 on both sides of the first gate electrode 310.

The second oxide semiconductor pattern 340B may overlap with and directly contact the metal oxide pattern 330B over the metal oxide pattern 330B, and may have sidewalls that are aligned with each other. The first oxide semiconductor pattern 340A may be formed over the dielectric pattern 335 and the first gate dielectric layer 320 to directly contact the dielectric pattern 335 and the first gate dielectric layer 320.

The second gate dielectric layer 360 may be positioned over the first and second oxide semiconductor patterns 340A and 340B, and the second gate electrode 370 overlapping with the first oxide semiconductor pattern 340A between the two second oxide semiconductor patterns 340B may be positioned over the second gate dielectric layer 360.

The source electrode 382 and the drain electrode 384 may pass through the inter-layer dielectric layer 380 and the second gate dielectric layer 360 and directly contact the second oxide semiconductor pattern 340B.

According to one embodiment of the present disclosure, a double gate structure in which gate electrodes are positioned below and over an oxide semiconductor layer may be realized. Even in this embodiment of the present disclosure, all of the advantages described in the foregoing embodiments may be obtained.

According to one embodiment of the present disclosure, the contact resistance with a source/drain electrode may be reduced by reducing the oxygen density of a source/drain region of an oxide semiconductor. The processing cost and processing time may be reduced by placing a heating pattern capable of generating heat when irradiated with light below the source/drain region of the oxide semiconductor.

While the present disclosure has been described with respect to the specific embodiments, it will be apparent to those skilled in the art that various changes and modifications may be made without departing from the scope of the disclosure.

What is claimed is:

1. A semiconductor device, comprising:
    a substrate;
    two heating patterns arranged to be spaced apart from each other over the substrate;
    two metal oxide patterns respectively positioned over the two heating patterns;
    two second oxide semiconductor patterns comprising source/drain regions and respectively positioned over the two metal oxide patterns;
    a first oxide semiconductor pattern forming a channel region positioned between the two second oxide semiconductor patterns;
    a gate electrode positioned over or below the first oxide semiconductor pattern; and
    a gate dielectric layer interposed between the gate electrode and the first oxide semiconductor pattern,
    wherein an oxygen density of the two second oxide semiconductor patterns is smaller than an oxygen density of the first oxide semiconductor pattern.

2. The semiconductor device of claim 1, wherein the two heating patterns include a metal.

3. The semiconductor device of claim 2, wherein the two metal oxide patterns include an oxide of the metal.

4. The semiconductor device of claim 1, wherein the two metal oxide patterns have sidewalls that are aligned with sidewalls of the two heating patterns while directly contacting the two heating patterns.

5. The semiconductor device of claim 1, wherein the two second oxide semiconductor patterns have sidewalls that are aligned with sidewalls of the two metal oxide patterns while directly contacting the two metal oxide patterns.

6. The semiconductor device of claim 1, further comprising:
    a source electrode and a drain electrode directly contacting and positioned over the two second oxide semiconductor patterns, respectively.

7. The semiconductor device of claim 6, further comprising:
    a storage element electrically connected to one of the source electrode and the drain electrode; and
    a conductive line electrically connected to another of the source electrode and the drain electrode.

8. The semiconductor device of claim 1, further comprising:
    a dielectric pattern in which the two heating patterns and the two metal oxide patterns are buried,
    wherein the first oxide semiconductor pattern directly contacts the dielectric pattern.

9. The semiconductor device of claim 1, wherein the gate dielectric layer is formed over the first oxide semiconductor pattern and over the two second oxide semiconductor patterns, and
    the gate electrode is formed to overlap with the first oxide semiconductor pattern.

10. The semiconductor device of claim 1, wherein the gate electrode is positioned between the two heating patterns and over the substrate, and
    the gate dielectric layer is formed over the gate electrode and the substrate, and
    the two heating patterns are positioned over the gate dielectric layer on both sides of the gate electrode.

11. The semiconductor device of claim 10, wherein an uppermost surface of the gate dielectric layer directly contacts the first oxide semiconductor pattern.

12. The semiconductor device of claim 1, wherein the gate electrode includes a first gate electrode positioned between the two heating patterns, and a second gate electrode formed to overlap with the first oxide semiconductor pattern, and the gate dielectric layer includes a first gate dielectric layer formed over the first gate electrode and the substrate, and a second gate dielectric layer formed over the first oxide semiconductor pattern and over the two second oxide semiconductor patterns, and
    the two heating patterns are positioned over the first gate dielectric layer on both sides of the first gate electrode.

13. The semiconductor device of claim 12, wherein an uppermost surface of the first gate dielectric layer directly contacts the first oxide semiconductor pattern.

* * * * *